United States Patent
Lin et al.

(10) Patent No.: US 9,397,017 B2
(45) Date of Patent: Jul. 19, 2016

(54) SUBSTRATE STRUCTURES AND METHODS OF MANUFACTURE

(71) Applicant: SEMICONDUCTOR COMPONENTS INDUSTRIES, LLC, Phoenix, AZ (US)

(72) Inventors: Yusheng Lin, Phoenix, AZ (US); Sadamichi Takakusaki, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/816,520

(22) Filed: Aug. 3, 2015

(65) Prior Publication Data

US 2016/0133533 A1   May 12, 2016

Related U.S. Application Data

(63) Continuation-in-part of application No. 14/534,482, filed on Nov. 6, 2014.

(51) Int. Cl.

| H01L 21/50 | (2006.01) |
|---|---|
| H01L 25/00 | (2006.01) |
| H01L 23/06 | (2006.01) |
| H01L 23/14 | (2006.01) |
| H01L 23/488 | (2006.01) |
| H01L 23/498 | (2006.01) |
| H01L 23/538 | (2006.01) |
| H01L 23/00 | (2006.01) |
| H01L 21/768 | (2006.01) |
| H01L 23/492 | (2006.01) |
| H01L 23/02 | (2006.01) |

(52) U.S. Cl.
CPC ........ *H01L 23/142* (2013.01); *H01L 21/76886* (2013.01); *H01L 23/02* (2013.01); *H01L 23/492* (2013.01); *H01L 23/498* (2013.01); *H01L 23/5383* (2013.01); *H01L 24/83* (2013.01); *H01L 2924/01029* (2013.01)

(58) Field of Classification Search
None
See application file for complete search history.

(56) References Cited

U.S. PATENT DOCUMENTS

| 6,259,157 B1 | 7/2001 | Sakamoto et al. |
| 6,593,169 B2 | 7/2003 | Iimura et al. |
| 7,078,797 B2 | 7/2006 | Suzuki et al. |
| 7,102,211 B2 | 9/2006 | Ochiai et al. |

(Continued)

FOREIGN PATENT DOCUMENTS

| DE | 102009033029 A1 | 1/2011 |
| DE | 102012206758 B3 | 5/2013 |

(Continued)

*Primary Examiner* — Zandra Smith
*Assistant Examiner* — Molly Reida
(74) *Attorney, Agent, or Firm* — Adam R. Stephenson, LTD.

(57) ABSTRACT

A semiconductor package. Implementations may include a substrate including a metallic baseplate coupled with an electrically insulative layer and a plurality of metallic traces coupled to the electrically insulative layer on a surface of the electrically insulative layer opposing a surface of the electrically insulative layer coupled to the metallic baseplate. The plurality of metallic traces may include at least two different trace thicknesses, where the trace thicknesses are measured perpendicularly to the surface of the electrically insulative layer coupled with the metallic baseplate. The package may include at least one semiconductor device coupled to the substrate, a mold compound that encapsulates the power electronic device and at least a portion of the substrate, and at least one package electrical connector coupled with the substrate.

4 Claims, 13 Drawing Sheets

(56) References Cited

U.S. PATENT DOCUMENTS

| | | |
|---|---|---|
| 7,186,921 B2 | 3/2007 | Igarashi et al. |
| 7,221,049 B2 | 5/2007 | Igarashi et al. |
| 7,232,957 B2 | 6/2007 | Mizutani et al. |
| 7,253,027 B2 | 8/2007 | Kanakubo |
| 7,315,083 B2 | 1/2008 | Igarashi et al. |
| 7,491,894 B2 | 2/2009 | Suzuki et al. |
| 7,521,290 B2 | 4/2009 | Takakusaki et al. |
| 7,714,232 B2 | 5/2010 | Igarashi et al. |
| 7,935,899 B2 | 5/2011 | Takukusaki et al. |
| 7,936,569 B2 | 5/2011 | Takakusaki et al. |
| 7,957,158 B2 | 6/2011 | Takakusaki et al. |
| 8,749,052 B2 * | 6/2014 | Schulz-Harder .... H01L 23/3735 257/675 |
| 2006/0046485 A1 * | 3/2006 | Maeng ............... H01L 21/486 438/689 |
| 2012/0134115 A1 * | 5/2012 | Schulz-Harder .... H01L 23/3735 361/720 |
| 2013/0175707 A1 * | 7/2013 | Chew ............... H01L 23/49537 257/778 |

FOREIGN PATENT DOCUMENTS

| | | |
|---|---|---|
| JP | 1999-027470 | 1/1999 |
| JP | 2003-318334 | 11/2003 |
| JP | 2006-237561 | 9/2006 |
| JP | 2007-036013 | 2/2007 |
| JP | 2008-022033 | 2/2008 |

* cited by examiner

SUBSTRATE STRUCTURES AND METHODS OF MANUFACTURE

CROSS REFERENCE TO RELATED APPLICATIONS

This application is a continuation-in-part application of the earlier U.S. Utility Patent Application to Lin et al. entitled "Substrate Structures and Methods of Manufacture," application Ser. No. 14/534,482, filed Nov. 6, 2014, now pending, the disclosure of which is hereby incorporated entirely herein by reference.

BACKGROUND

1. Technical Field

Aspects of this document relate generally to substrate structures for semiconductor integrated circuit components. More specific implementations involve substrate structures for power modules.

2. Background Art

Substrate structures for semiconductor integrated circuits, such as power modules, are used to route components internal and external to an integrated circuit and to dissipate heat. Direct bonded copper (DBC) substrates include a ceramic layer with a layer of copper bonded to one or both sides. Insulated metal substrate (IMS) substrates include a metal baseplate covered by a thin layer of dielectric (usually an epoxy-based layer) and a layer of copper.

SUMMARY

Implementations of semiconductor packages may include a substrate including a metallic baseplate coupled with an electrically insulative layer and a plurality of metallic traces coupled to the electrically insulative layer on a surface of the electrically insulative layer opposing a surface of the electrically insulative layer coupled to the metallic baseplate. The plurality of metallic traces may include at least two different trace thicknesses, where the trace thicknesses are measured perpendicularly to the surface of the electrically insulative layer coupled with the metallic baseplate. The package may include at least one semiconductor device coupled to the substrate, a mold compound that encapsulates the power electronic device and at least a portion of the substrate, and at least one package electrical connector coupled with the substrate.

Implementations of semiconductor packages may include one, all, or any of the following:

Each of the plurality of metallic traces may include copper.
Each of the metallic traces may include a layer of nickel, gold, or nickel and gold plated onto the second surface of the metallic trace.

The electrically insulative layer may include an epoxy.

The electrically insulative layer may be an insulated metal substrate (IMS).

The substrate may be a direct bonded copper (DBC) substrate.

The plurality of metallic traces may include two or more layers where each of the two more layers have a different cross sectional width from a cross sectional width of each other layer.

The at least one package electrical connector may be a pin that extends out of the mold compound.

Implementations of a semiconductor package for a semiconductor device may include a substrate including a metallic baseplate including a first surface and a second surface opposing the first surface, and an electrically insulative layer comprising a first surface coupled to the second surface of the metallic baseplate where the electrically insulative layer has a second surface opposing the first surface of the electrically insulative layer. The package may also include a plurality of metallic traces coupled to the second surface of the electrically insulative layer at a first surface of the metallic trace where each metallic trace has a second surface opposing the first surface of the metallic trace. At least one of the metallic traces may have a thickness measured along a direction perpendicular to the second surface of the metallic baseplate that is greater than a thickness of another one of the metallic traces also measured along a direction perpendicular to the second surface of the metallic baseplate. The package may also include a semiconductor device coupled to the substrate, a mold compound encapsulating the semiconductor device and at least a portion of the substrate, and at least one package electrical connector coupled with the substrate.

Implementations of a semiconductor package may include one, all or any of the following:

Each of the plurality of metallic traces may include copper.
Each of the metallic trace may include a layer of nickel, gold, or nickel and gold plated onto the second surface of the metallic trace.

The electrically insulative layer may include an epoxy.

The electrically insulative layer may be an IMS.

The substrate may be a DBC substrate.

The plurality of metallic traces may include two more layers, where each of the two or more layers have a different cross sectional width from a cross sectional width of each other layer.

The at least one package electrical connector may be a pin that extends out of the mold compound.

Implementations of a method of forming a semiconductor package may include providing an electrically insulative layer having a first surface opposing a second surface, plating a first copper layer onto the second surface of the electrically insulative layer, patterning the first copper layer, and forming traces in the first copper layer by etching through exposed portions of the first copper layer. The method may also include plating a second copper layer onto the traces in the first copper layer, patterning the second copper layer, and forming traces in the second copper layer that correspond with the traces in the first copper layer by etching through exposed portions of the second copper layer. The method may also include bonding at least one semiconductor device with at least one of the traces in the second copper layer, encapsulating the at least one semiconductor device with a mold compound, and bonding at least one package electrical connector with the first copper layer and the second copper layer. A width of the traces of the second copper layer may be thinner than a width of the traces of the first copper layer by an offset distance.

Implementations of the method may include one, all, or any of the following:

The method may further include plating a third copper layer onto the traces in the second copper layer, patterning the third copper layer, forming traces in the third copper layer that correspond with the traces in the second copper layer by etching through exposed portions of the third copper layer, and bonding at least one semiconductor device with at least one of the traces in the third copper layer. A width of the traces of the third copper layer may be thinner than a width of the traces of the second copper layer by an offset distance.

The first copper layer and the second copper layer may have different thicknesses measured perpendicularly to the second surface of the electrically insulative layer.

The method may further include plating a first copper layer on the first surface of the electrically insulative layer, patterning the first copper layer, removing an exposed portion of the first copper layer, plating a second copper layer onto the first copper layer, patterning the second copper layer, and removing an exposed portion of the second copper layer. A distance from an edge of the electrically insulative layer to an edge of the first copper layer may be smaller than a distance from the edge of the electrically insulative layer to an edge of the second copper layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended substrate structures and methods of manufacture will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such substrate structures and methods of manufacture, and implementing components and methods, consistent with the intended operation and methods.

Figure 1:
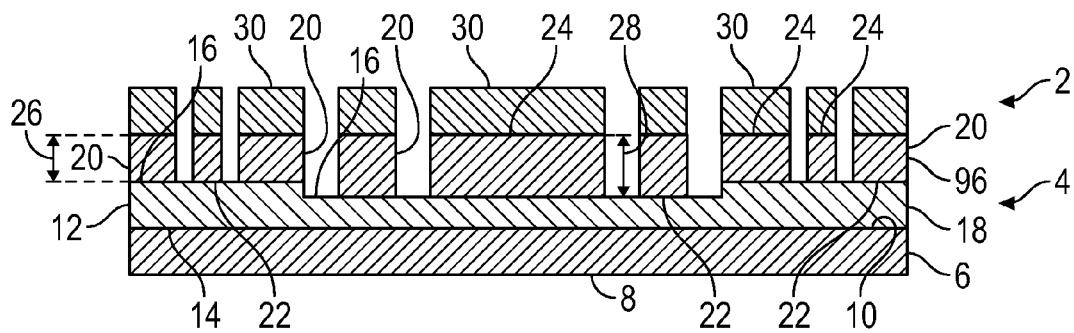
FIG. 1 is a cross-section view of an implementation of an insulated metal substrate (IMS)

Referring now to FIG. 1, an implementation of a power electronic substrate 2 is illustrated that includes an insulated metal substrate (IMS) 4. The IMS 4 has a metallic baseplate 6 which may be formed of, by non-limiting example, aluminum, copper, steel, and other heat-conducting materials. The metallic baseplate 6 has a first surface 8 which is configured to couple to, by non-limiting example, a heat sink, a motherboard, and the like. The metallic baseplate 6 has a second surface 10 on an opposite (opposing) side from the first surface 8.

A dielectric layer 12 is coupled to the metallic baseplate 6. The dielectric layer 12 has a first surface 14 which is coupled to the second surface 10 of the metallic baseplate 6 and a second surface 16 on an opposite side of the dielectric layer 12 from the first surface 14. In various implementations the dielectric layer 12 includes a resin or epoxy 18, though in other implementations it may include other dielectric (electrically insulative) materials.

Figure 7:
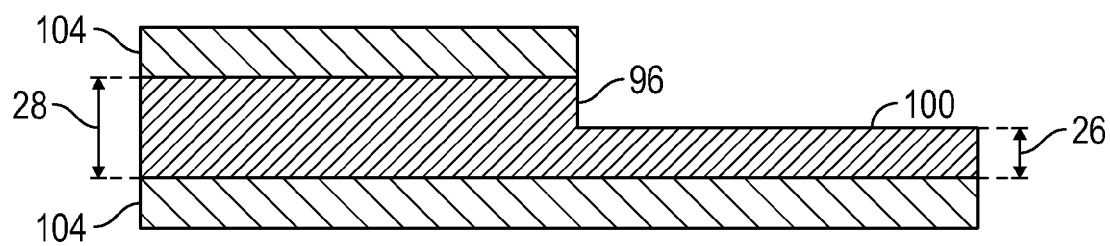
FIG. 7 is a cross-section view of the elements of FIG. 6 with a pattern etched into the copper layer.
Figure 8:
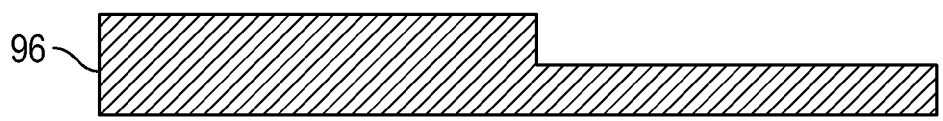
FIG. 8 is a cross-section view of the copper layer of FIG. 7 with the photoresist layers removed.
Figure 9:
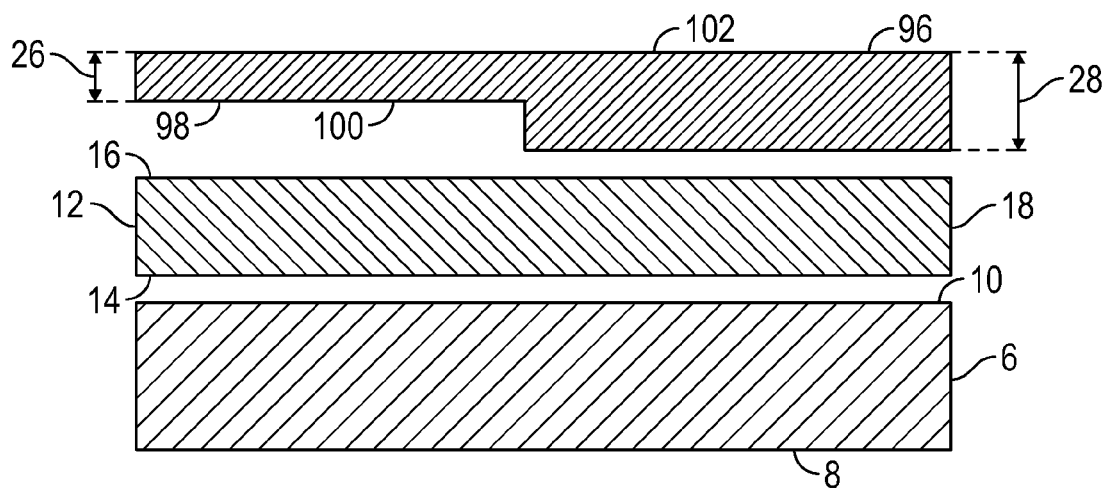
FIG. 9 is a cross-section view of the copper layer of FIG. 8, a dielectric layer and a metallic baseplate of an IMS prior to being coupled together.
Figure 17:
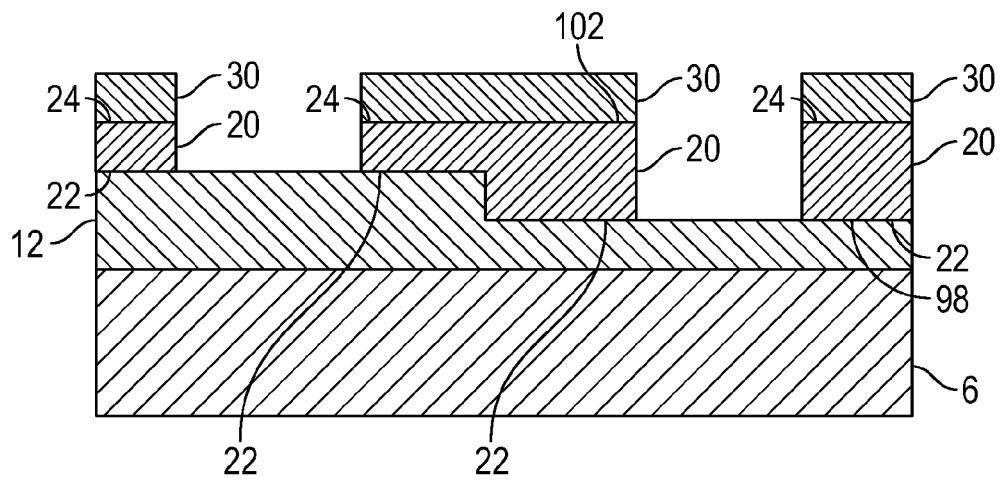
FIG. 17 is a cross-section view of the elements of FIG. 16 with the nickel plating and copper layer having been etched through at the pattern in the second layer of photoresist and the second layer of photoresist then removed.
Figure 18:
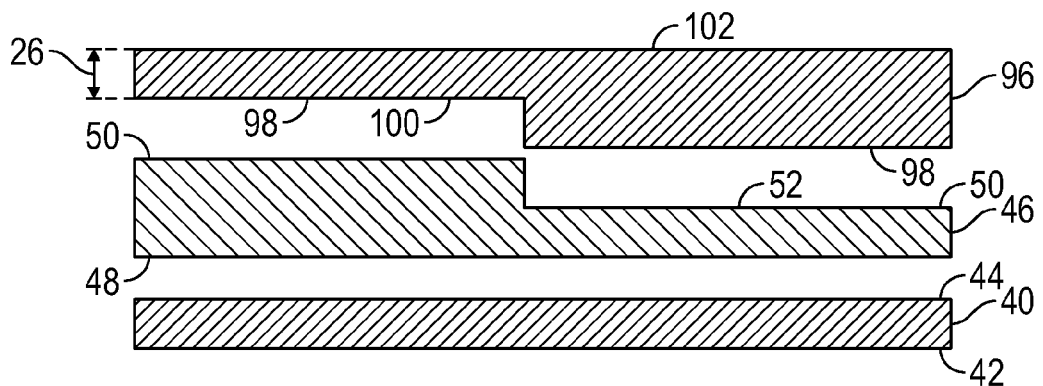
FIG. 18 is a cross-section view of the copper layer of FIG. 8 having a pattern thereon, a ceramic layer having a complementary pattern, and a metallic base plate of a DBC substrate prior to being coupled together.

A plurality of traces 20 are formed and coupled to the dielectric layer 12. Each trace 20 has a first surface 22 coupled to the second surface 16 of the dielectric layer 12 and a first surface 22 on an opposite side of the trace 20 from the first surface 22. The traces 20 are metallic and may be formed of, by non-limiting example, copper, aluminum, or other electrically conductive materials. Some of the traces 20 have a first thickness 26, measured from the first surface 22 to the second surface 24, and some of the traces 20 have a second thickness 28, greater than the first thickness 26, measured from the first surface 22 to the second surface 24. In some implementations there could be traces 20 having a third thickness sized differently from both the first thickness 26 and second thickness 28 or other traces that contain both the first thickness and the second thickness. Referring to FIGS. 7-9, the difference in thicknesses is created at least in part by a pattern 100 which is formed in a first surface 98 of a copper layer 96 from which the traces 20 are formed, which will be discussed hereafter, and the traces 20 which have the smaller first thickness 26 correspond with the pattern 100 or, in other words, are located at the pattern 100 or formed of the material that composes the pattern 100. Referring back to FIG. 1, a layer of nickel 30 is included on the second surface 24 of each metallic trace 20. In implementations a single trace 20 may have different thicknesses in different places and so may include the first thickness 26, second thickness 28, a third thickness, and so on. A trace 20 of this nature is illustrated in FIG. 17.

Figure 2:
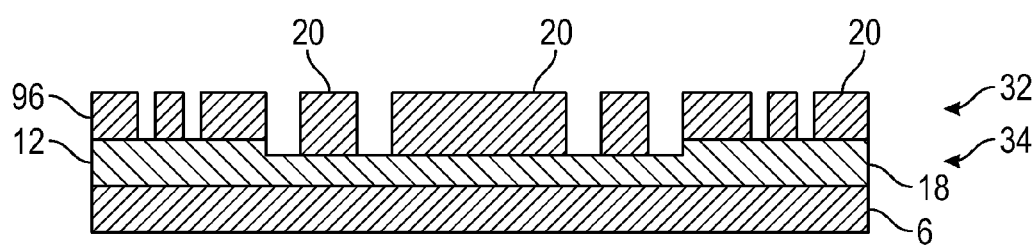
FIG. 2 is a cross-section view of another implementation of an IMS.

Referring now to FIG. 2, in particular implementations a power electronic substrate 32 is an IMS 34 that is similar in structure to IMS 4 except the traces lack the nickel 30 atop the traces 20.

Figure 3:
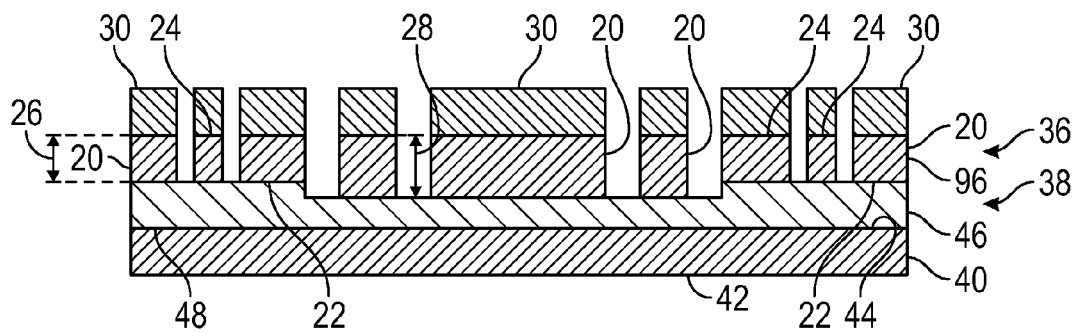
FIG. 3 is a cross-section view of an implementation of a direct bonded copper (DBC) substrate.
Figure 4:
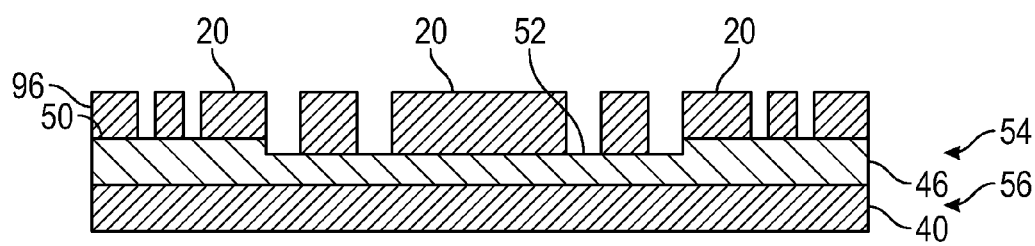
FIG. 4 is a cross-section view of another implementation of a DBC substrate.
Figure 5:
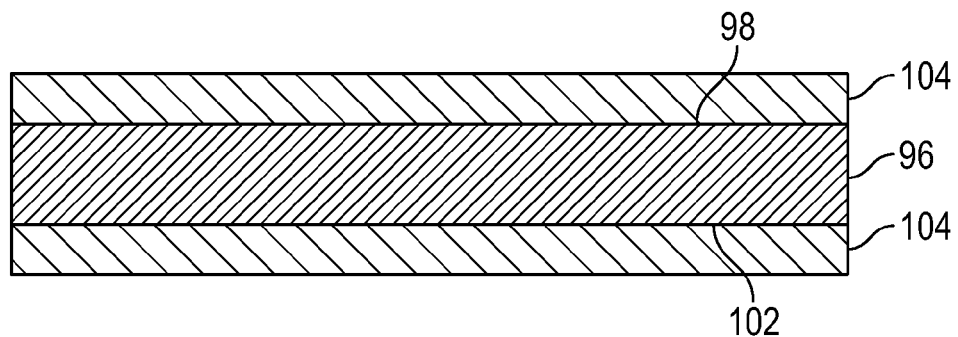
FIG. 5 is a cross-section view of a copper layer having photoresist layers thereon.

Referring now to FIGS. 3 and 4, implementations of a power electronic substrate 36 that are direct bonded copper (DBC) substrates are illustrated. The DBC substrate 38 has a metallic baseplate 40 which may be formed of, by non-limiting example, copper, aluminum, steel, and the like. The metallic baseplate 40 has a first surface 42 configured to couple to, by non-limiting example, a heat sink, a motherboard, and the like, and further has a second surface 44 on an opposite side of the metallic baseplate 40 from the first surface 42. A first surface 48 of a ceramic layer 46 is coupled to the second surface 44 of the metallic baseplate 40. The ceramic layer 46 has a second surface 50 on an opposite side of the ceramic layer 46 from the first surface 48. A pattern 52 is formed in the second surface 50 of the ceramic layer 46 which may be formed, by non-limiting example, with a number of patterning techniques used to etch and shape ceramic materials. The ceramic layer 46 may be half-etched, though in implementations the etching may go more or less than halfway through the ceramic layer 46. The etching may be accomplished through wet-etching techniques. In other implementations, the ceramic layer 46 may be patterned through printing, molding, or stamping when the ceramic material is still soft and pliable before curing, firing, or sintering of the layer has taken place.

The DBC substrate 38 has a plurality of traces 20 similar to IMS 4. The traces 20 having the larger second thickness 28, measured between the first surface 22 and second surface 24, correspond with the pattern 52, or in other words are located at or formed from the pattern 52. A layer of nickel 30 is placed atop each trace 20, similar to IMS 4, which may be plated onto the traces 20.

Referring now to FIG. 4, in implementations a power electronic substrate 54 is a DBC substrate 56 that is similar to DBC substrate 38 except it lacks the nickel layer 30.

Figure 6:
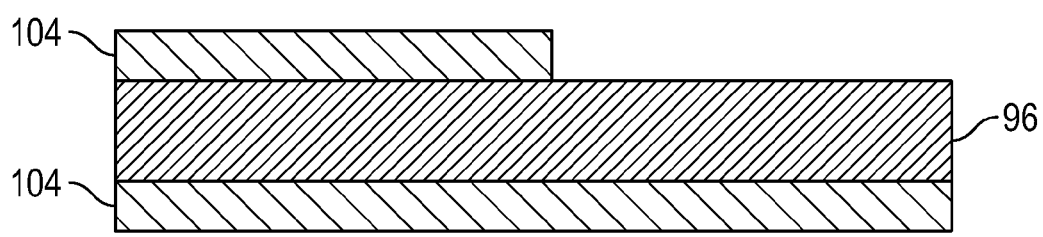
FIG. 6 is a cross-section view of the elements of FIG. 5 with a pattern formed in one of the photoresist layers.

Referring now to FIGS. 5-17, a method of forming an IMS 4 is illustrated. A copper layer 96 is first processed where the copper layer 96 has a first surface 98 and a second surface 102 on an opposite side of the copper layer 96 from the first surface 98. A layer of photoresist 104 is placed on the first surface 98 and another layer of photoresist 104 is placed on the second surface 102. A pattern is formed in the photoresist 104 on the first surface 98, as seen in FIG. 6. This may be done by exposing a portion of the photoresist 104 to ultraviolet (UV) light or other exposure techniques which make a portion of the photoresist 104 more resistant (or more susceptible) to being removed, and then developing the photoresist 104 with a solution that removes the treated (or untreated) portion to form the pattern.

While only a single part of the pattern is shown, it may be understood that FIG. 6 is a close-up view of only a portion of the elements, and that in reality a pattern of traces and other shapes may be formed in the photoresist 104. An etching process is then used to etch a pattern 100 into the first surface 98 of the copper layer 96 through the spaces formed in the photoresist 104. This may be done using any conventional etching mechanisms used to etch copper. The formation of the pattern 100 forms locations of the copper layer 96 that have the first thickness 26 and other locations that have the second thickness 28, the smaller first thickness 26 corresponding with the patterned areas where the first surface 98 has been etched. It can be seen from FIG. 7 that the etching of the copper layer 96 is a partial etch which does not go all the way through to the second surface 102. In some implementations, the etching may be half-etched. In other implementations, the pattern 100 may be etched more or less than halfway through the copper layer 96.

Referring now to FIG. 8, after the pattern 100 has been etched into the first surface 98 the layers of photoresist 104 are removed. It may be understood that the layer of photoresist 104 that was placed on the second surface 102 is used to prevent the second surface 102 from being etched during the etching process—such as, for instance, in cases where the etching was done with wet etching where the entire copper layer 96 was placed in an etching solution. Any of a wide variety of conventional methods for removing the photoresist 104 (ashing, solvent cleaning, etc.) may be employed in various implementations.

Referring now to FIG. 9, a metallic baseplate 6 is illustrated that has a first surface 8 and second surface 10 as previously described. A dielectric layer 12 having first surface 14 and second surface 16 is also provided, which in the implementation shown includes an epoxy 18. The copper layer 96 is positioned so that its first surface 98 faces the second surface 16 of the dielectric layer 12.

Figure 10:
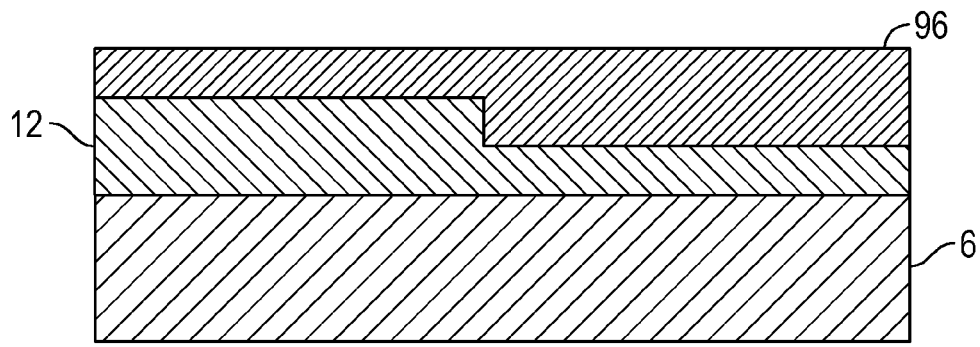
FIG. 10 is a cross-section view of the elements of FIG. 9 coupled together.

Referring now to FIG. 10, the copper layer 96, dielectric layer 12, and metallic baseplate 6 are illustrated after having been coupled together through a laminating or other pressure bonding process that presses the layers together. During the bonding step, the dielectric layer 12 flows under the pressure forces during this step of assembly and accommodates the pattern 100, as seen in FIG. 10, embedding the pattern 100 into the dielectric layer 12. This bonding/laminating step forms a complementary, or substantially complementary pattern, to the pattern 100 in the dielectric layer 12.

Figure 11:
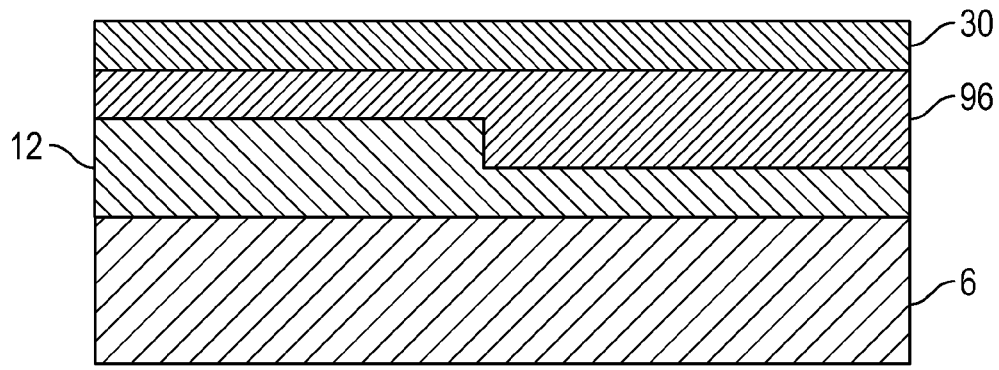
FIG. 11 is a cross-section view of the elements of FIG. 10 with nickel plating atop the copper layer.
Figure 12:
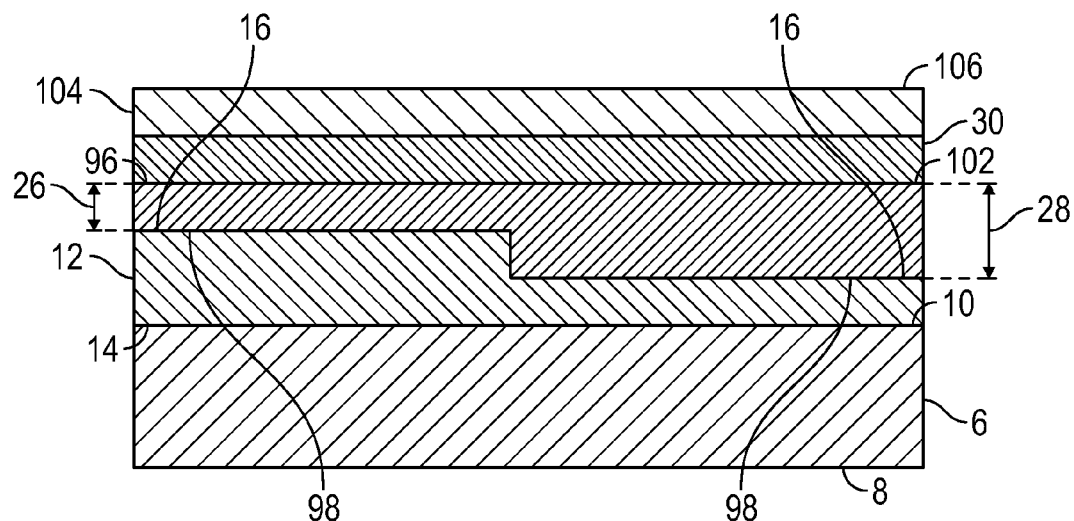
FIG. 12 is a cross-section view of the elements of FIG. 11 with a first layer of photoresist placed atop the nickel plating.
Figure 13:
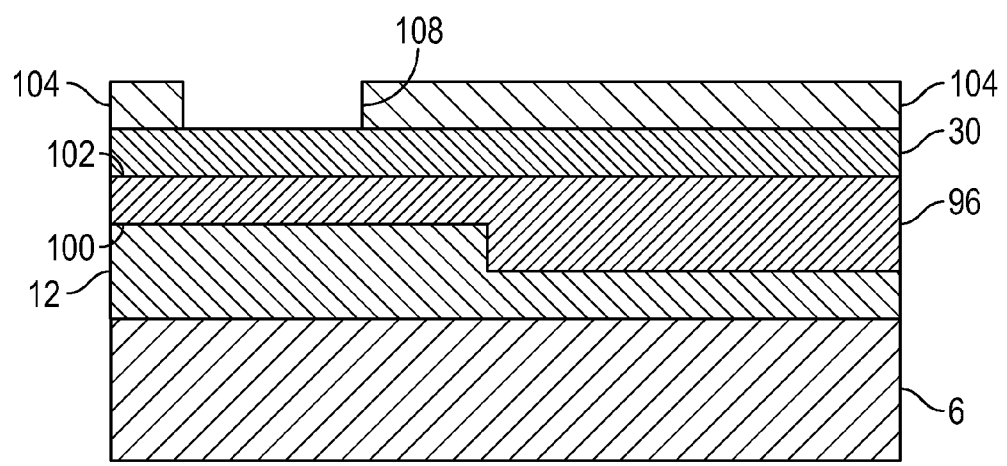
FIG. 13 is a cross-section view of the elements of FIG. 12 with a pattern formed in the layer of photoresist.
Figure 14:
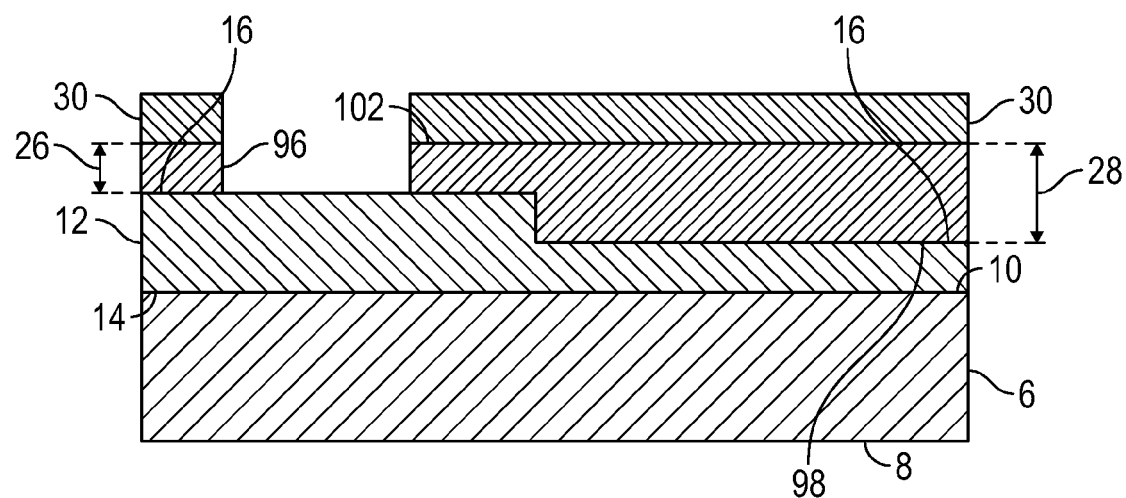
FIG. 14 is a cross-section view of the elements of FIG. 12 with the nickel plating and copper layer having been etched through at the pattern in the first layer of photoresist and the first layer of photoresist then removed.

Referring to FIG. 11, a layer of nickel 30 is plated or otherwise deposited onto the copper layer 96. As illustrated in FIGS. 12-14, a first layer 106 of photoresist 104 is placed atop the nickel 30 and a pattern 108 is formed therein. While only one space of the pattern 108 is shown, it may be understood that this is a close-up view showing only a small portion of the elements, so that in reality a number of patterned areas may be formed in the first layer 106 of photoresist 104. The nickel plating 30 and copper layer 96 are then fully etched down to the dielectric layer 12 at the pattern 108 and then the first layer 106 of photoresist 104 is removed, as seen in FIG. 14.

Figure 15:
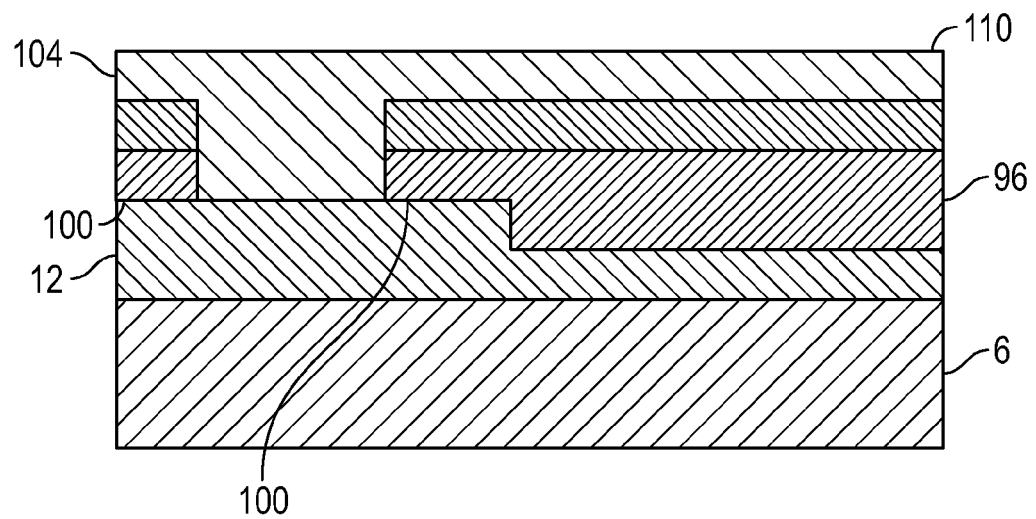
FIG. 15 is a cross-section view of the elements of FIG. 14 with a second layer of photoresist placed thereon.
Figure 16:
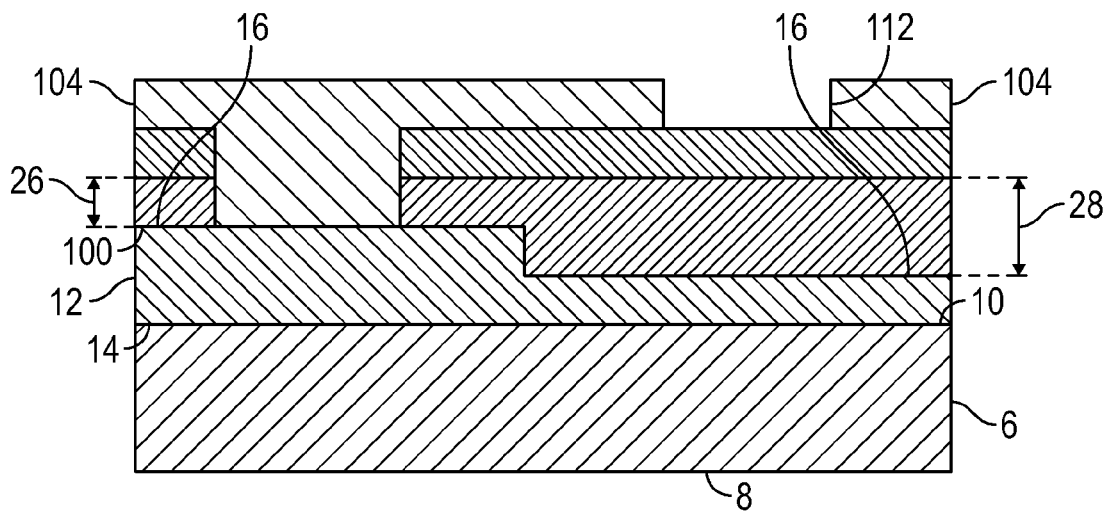
FIG. 16 is a cross-section view of the elements of FIG. 15 with a pattern formed in the second layer of photoresist.

A second layer 110 of photoresist 104 is then coated onto the elements as shown in FIG. 15 and a second pattern 112 is formed therein. Although only a single space of the pattern 112 is shown, it may be understood that a number of spaces may be formed therein. The nickel layer 30 and copper layer 96 are then fully etched through down to the dielectric layer at the pattern 112 to form the traces 20 and the second layer 110 of photoresist 104 is removed. Some of the traces 20 have the first thickness 26 and some have the second thickness 28—and in the implementation shown some have both the first thickness 26 and second thickness 28.

It may be perceived that a slightly modified version of this process may be used to form IMS 34 illustrated in FIG. 2, wherein the step of adding the nickel 30 is unnecessary and the etching processes to form the traces 20 accordingly do not involve etching through the nickel 30. It may also be understood that the process could be slightly modified to form traces 20 of more than two thicknesses. By non-limiting example, layers of photoresist 104 could be coated onto the copper layer 96 shown in FIG. 8, a pattern formed therein, and an etching process may then be used to etch a second pattern into the copper layer 96, which if etched to a different depth in the copper layer 96, may be used to form a third thickness in the copper layer 96 different than the first thickness 26 and second thickness 28. This process could be repeated numerous times to form many thicknesses in the copper layer 96. This may be done with the second surface 16 of the copper layer 96 remaining flat and, accordingly, the remaining process steps are identical or fairly identical to those described previously.

Figure 19:
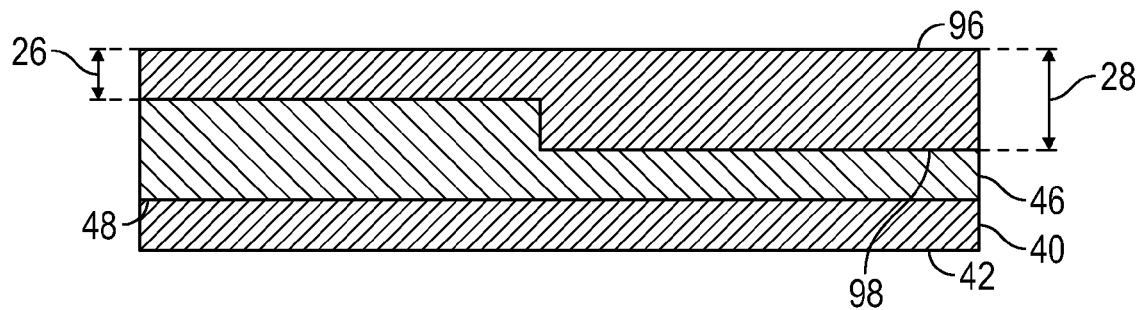
FIG. 19 is a cross-section view of the elements of FIG. 18 coupled together.
Figure 20:
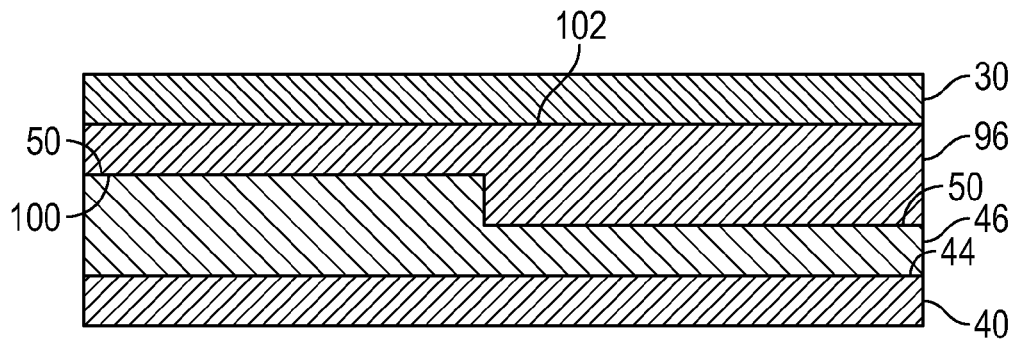
FIG. 20 is a cross-section view of the elements of FIG. 19 with a layer of nickel plated onto the copper layer.
Figure 21:
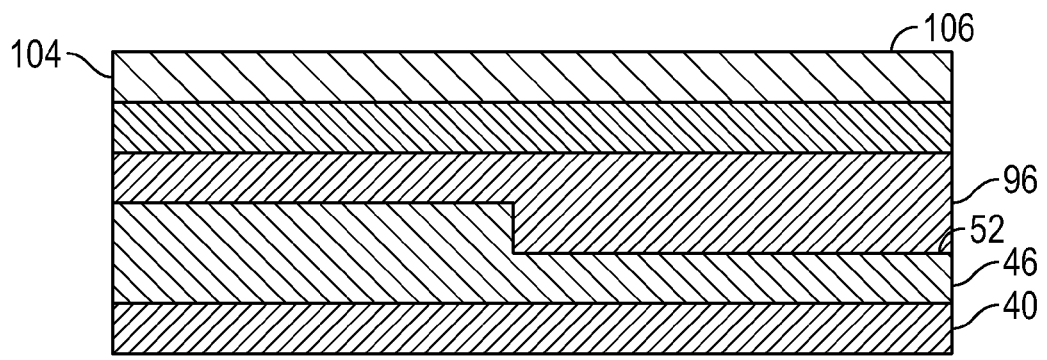
FIG. 21 is a cross-section view of the elements of FIG. 20 with a first layer of photoresist placed atop the nickel plating.
Figure 22:
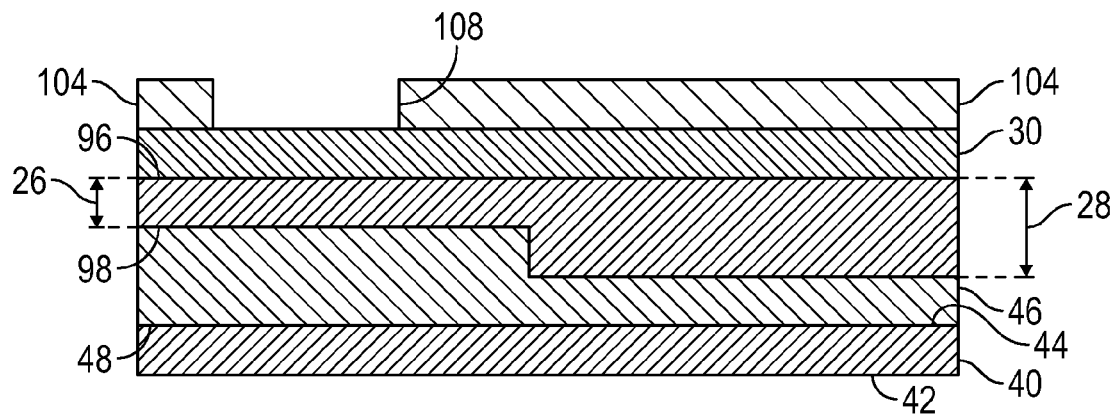
FIG. 22 is a cross-section view of the elements of FIG. 21 with a pattern formed in the first layer of photoresist.
Figure 23:
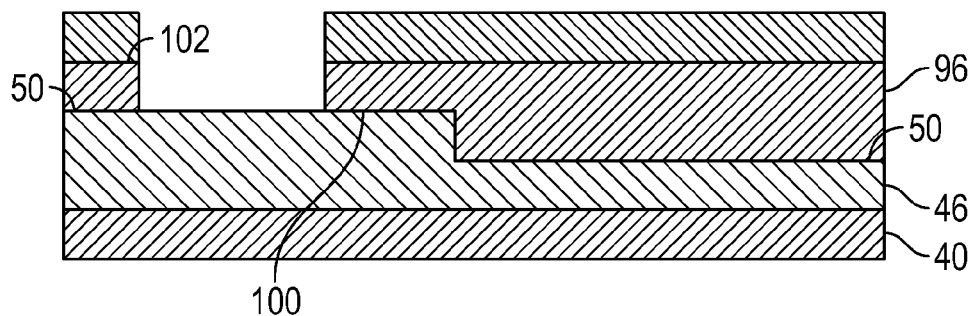
FIG. 23 is a cross-section view of the elements of FIG. 22 with the nickel and copper layers having been etched through at the pattern in the first layer of photoresist and the first layer of photoresist having being removed.

FIGS. 18-26 show a process of forming DBC substrate 38, which in some aspects is similar to the process described above for forming IMS 4, as it involves patterning a layer of copper as was previously described for use in subsequent processing. As A pattern 100 is formed in the first surface 98 of the copper layer 96 as already described in this document. With respect to shaping the ceramic layer, a pattern 52 is formed in the second surface 50 of the ceramic layer 46 which is complementary, or substantially complementary, to the pattern 100 in the copper layer 96. The pattern 52 in the ceramic layer 46 may be formed using any of a variety of techniques for etching or shaping ceramic materials, including photoresist masking and dry or wet etching, or through stamping/forming processes prior to the ceramic material being cured/dried/fired/sintered. As shown in FIG. 19, the copper layer 96, ceramic layer 46 and metallic baseplate 40 are bonded together through a sintering or other similar process used to form intermetallic or other bonding layers between the copper and the ceramic material. A layer of nickel 30 is coupled atop the copper layer 96, through electroplating or deposition as shown in FIG. 20, and atop this a first layer 106 of photoresist 104 is added as shown in FIG. 21. A pattern 108 is formed in the first layer 106, as shown in FIG. 22. As described above, although only a single space is formed there may be a plurality of spaces in the pattern 108. The nickel 30 and copper layer 96 are fully etched through at the gap 108, revealing the ceramic layer 46, and the first layer 106 of photoresist 104 is then removed, as illustrated in FIG. 23.

Figure 24:
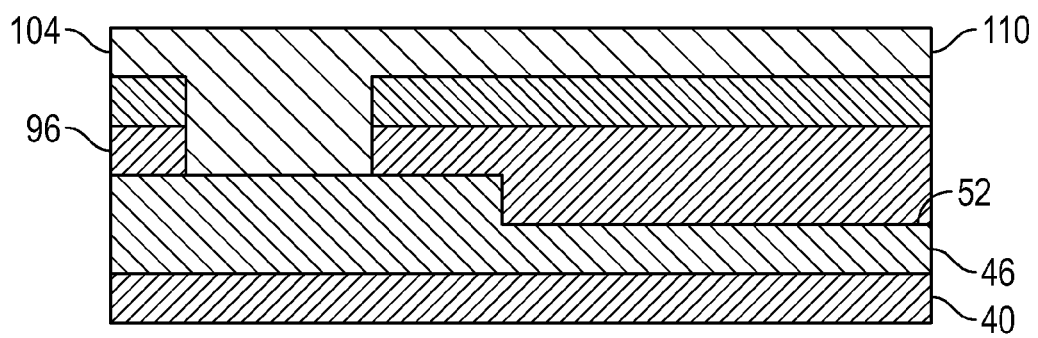
FIG. 24 is a cross-section view of the elements of FIG. 23 with a second layer of photoresist placed thereon.
Figure 25:
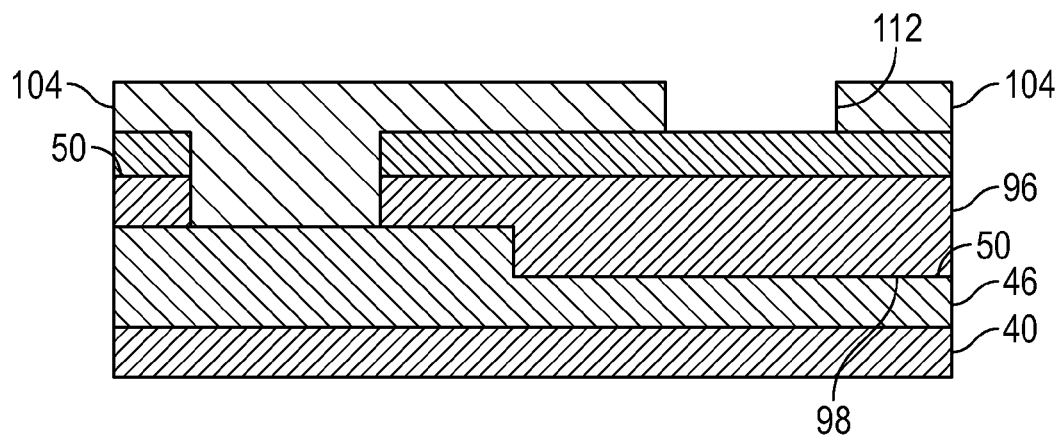
FIG. 25 is a cross-section view of the elements of FIG. 24 with a pattern formed in the second layer of photoresist.
Figure 26:
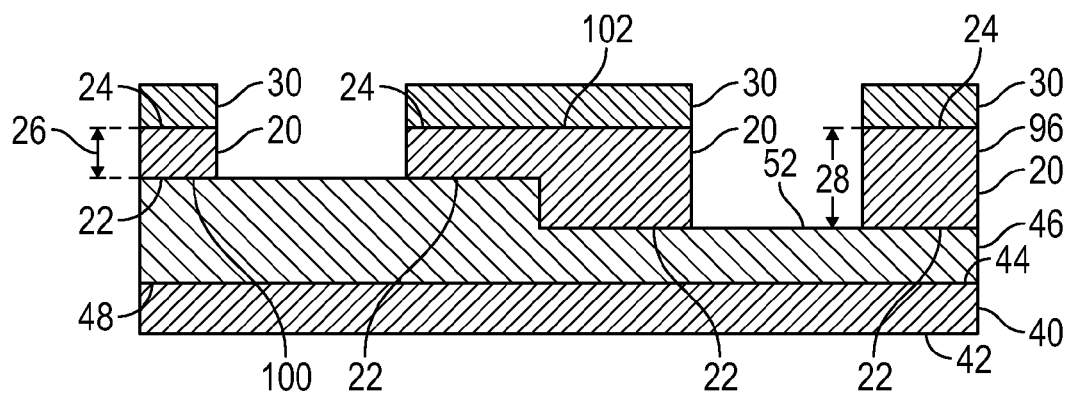
FIG. 26 is a cross-section view of the elements of FIG. 25 with the nickel and copper layers having been etched through at the pattern in the second layer of photoresist and the second layer of photoresist having been removed.

A second layer 110 of photoresist 104 is then added to the elements as shown in FIG. 24 and a pattern 112 is formed therein, as seen in FIG. 25. Again, there may be a plurality of spaces composed in the pattern 112. The nickel layer 30 and copper layer 96 are fully etched through at the pattern down to the ceramic layer 46 to form the traces 20, and the second layer 110 of photoresist 104 is removed. Some traces 20 have the first thickness 26 and some have the second thickness 28 and, if desired, the process may be used to form some traces 20 having both thicknesses, as illustrated in FIG. 26. As with other processes described above, there may be more than two trace thicknesses by making slight modifications to the process as described above with respect to the process for forming IMS 4 to shape the copper layer 96. A process for forming DBC substrate 56 may be similar in many respects to the process for forming DBC substrate 38 except that the nickel plating 30 is not included (and, accordingly, is not etched through).

Figure 27:
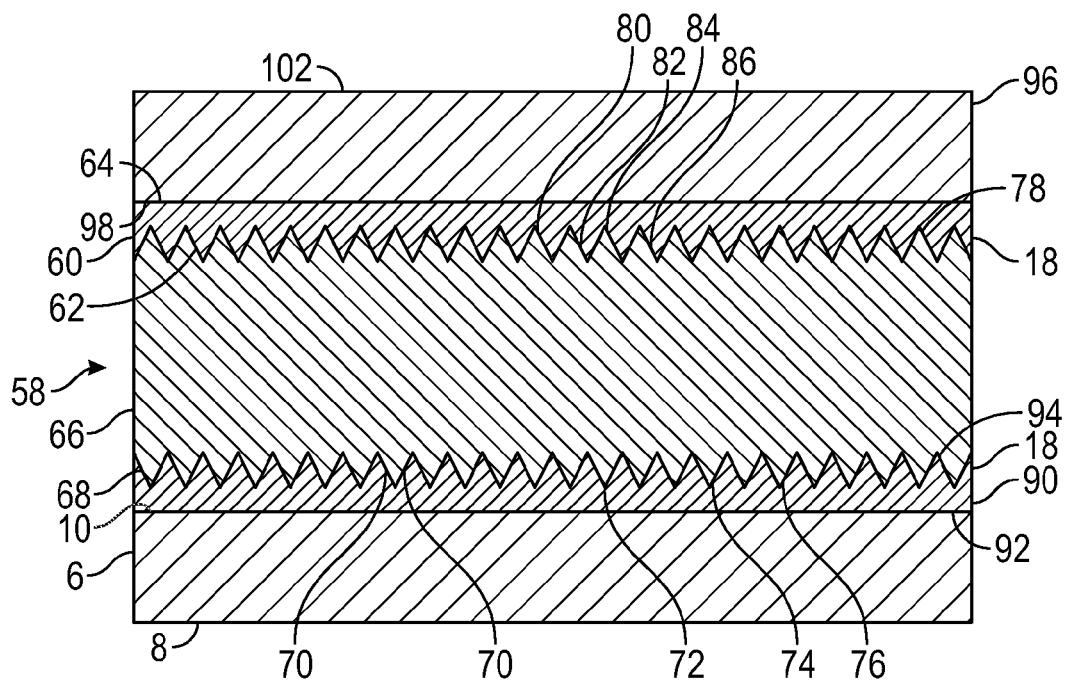
FIG. 27 is a cross-section close-up view a substrate implementation having a copper layer, a first dielectric layer, a ceramic layer, a second dielectric layer, and a metallic baseplate magnified.

FIG. 27 illustrates a power electronic substrate 58 that can be considered a hybrid as it has some elements similar to an IMS and some elements similar to a DBC substrate. A metallic baseplate 6 is used, having the first surface 8 and second surface 10 as previously described. There are two dielectric layers 60 and 90, and a ceramic layer 66 is sandwiched therebetween. The second dielectric layer 90 has a first surface 92, on an opposite side from a second surface 94, the first surface 92 being bonded to the second surface 10 of the metallic baseplate 6.

A first surface 68 of the ceramic layer 66 has a bonding pattern 70 thereon. This may include bonding ridges 72, conical projections 74, pyramidal projections 76, and the like dispersed on the first surface 68 of the ceramic layer. Other patterns and/or shapes may be employed to increase the surface area and/or the surface interaction between the ceramic layer 66 and the dielectric material. Referring to FIG. 27 (and the page on which the drawing is presented) the bonding pattern 70 may include a series of discrete elements that extend through the surface of the page (such as a grid or array of individual projections when viewed from above) and/or rows extending through the page surface. The second surface 94 of the second dielectric layer 90 receives the bonding pattern 70. This may be accomplished by the second dielectric layer 90 behaving as a fluid when it is being bonded to the ceramic layer 66 via a laminating or other pressure process inducing localized flow of the dielectric material to effectively form a pattern that is complementary, or substantially complementary, to the bonding pattern 70. The second dielectric layer 90 may be formed of an epoxy 18, and the bonding pattern 70 may assist the epoxy 18 to bond sufficiently to the ceramic layer 66.

A second surface 78 of the ceramic layer 66 opposite the first surface 68 also includes a bonding pattern 80, which may include any features or characteristics previously described with respect to bonding pattern 70, and may include bonding ridges 82, conical projections 84, pyramidal projections 86, and the like. Other patterns and/or shapes may be used. The first surface 62 of the first dielectric layer 60 receives the bonding pattern 80 and, accordingly, forms a complementary or substantially complementary pattern on the first surface 62. The first dielectric layer 60 may have any of the characteristics, features, and so forth of the second dielectric layer 90. A second surface 64 of the first dielectric layer 60, opposite the first surface 62, is bonded to a copper layer 96.

Figure 28:
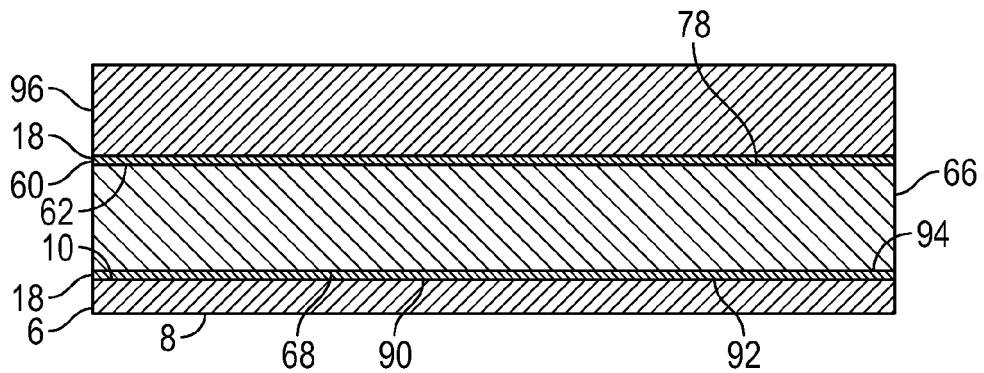
FIG. 28 is a cross-section view of the elements of FIG. 27 shown with less magnification.
Figure 29:
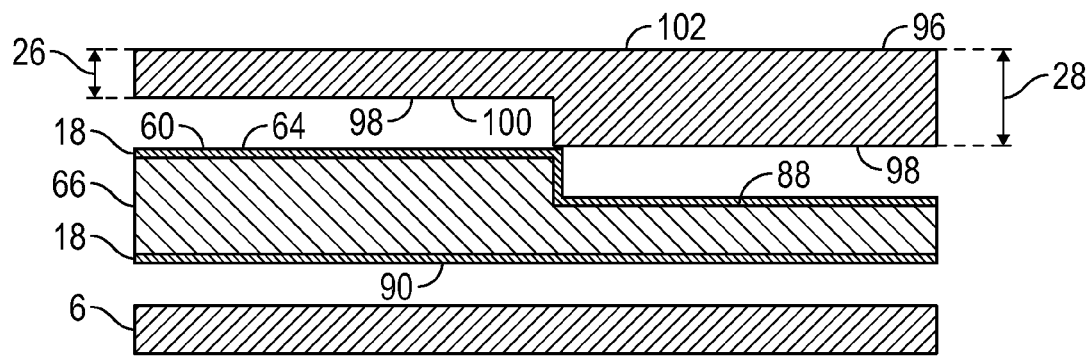
FIG. 29 is a cross-section view of the copper layer of FIG. 8 having a pattern thereon, a first dielectric layer, a ceramic layer having a pattern complementary to the copper layer, a second dielectric layer, and a metallic baseplate of a power electronic substrate prior to fully coupling the elements together.
Figure 30:
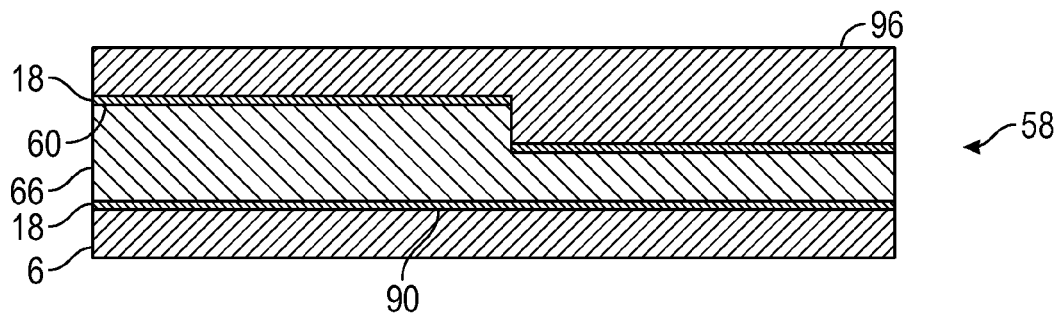
FIG. 30 is a cross-section view of the elements of FIG. 29 fully coupled together.

FIG. 28 is a view of the power electronic substrate 58 shown at a lesser degree of magnification so that the bonding patterns 70, 80 is not visible. Traces 20 may be formed in the copper layer 96 at this point, in a similar manner as described above with respect to other power electronic substrates. The power electronic substrate 58 may have a copper layer 96 (and accordingly, traces 20) of a uniform thickness, or the copper layer 96 may have a pattern 100 therein and the ceramic layer 66 may have a pattern 88 therein, as seen in FIGS. 29 and 30, that is complementary, or substantially complementary, to pattern 100 (and may be formed through etching processes as described herein) so that there will be traces 20 of varying thicknesses, which may be formed using techniques already described with respect to other power electronic substrates herein. In other implementations, however, the traces 20 may be formed without varying thicknesses.

In implementations of power electronic substrates disclosed herein which use an epoxy or resin for the dielectric layer, the dielectric layer may have a thickness from its first surface to its second surface of, or of about, 25 microns to, or to about, 300 microns. The epoxy or resin may include thermally conductive filler particles, such as by non-limiting example $SiO_2$, $Al_2O_3$, BN, or the like, dispersed therein. Copper layers described herein may be copper foil and may have, by non-limiting example, thicknesses ranging from, or from about, 18 microns to, or to about 200 microns, or greater. In implementations in which the metallic baseplates are formed of aluminum they may have an alumite and/or anodized aluminum layer on the first and second surfaces. Some metallic baseplates may have, by non-limiting example, a thickness from the first surface to the second surface of, or of about, 1.5 mm.

In implementations herein in which a ceramic layer is used the ceramic layer may include, by non-limiting example, alumina, aluminum nitride, and other high thermally conductive ceramic or composite materials. A copper layer may be directly bonded to a ceramic layer using a high-temperature oxidation process wherein the copper and ceramic are heated to a controlled temperature in a nitrogen atmosphere containing about 30 ppm of oxygen (or about 1.5% concentration of $O_2$ in atom percentage) to form a copper-oxygen eutectic which bonds both to the copper and to an oxide of the ceramic layer. In implementations the ceramic layer may be $Al_2O_3$ and a thin layer of copper-aluminum-spinel may bond the copper layer to the ceramic layer. In implementations the ceramic layer may be aluminum nitride and a thin layer of copper-aluminum-nitride may be formed by first oxidizing the surface of the aluminum nitride to form a layer of alumina by high temperature oxidation. In implementations a copper layer may be bonded to a ceramic layer using a sintering process. In particular implementations, the sintering process may involve melting or softening small particles comprised in each of the copper layer and the ceramic layer to bond them with adjacent small particles. By small in this process is meant microscopic particles.

The hybrid power electronic substrate 58 shown in FIGS. 27-30, due to the lack of a direct copper-to-ceramic bond, eliminates the need for the high temperature bonding processes described above. In addition, because there is no need for a high temperature bonding or other sintering process, the substrate 58 including a ceramic layer can be formed using laminating or other pressure bonding processes.

Implementations of IMS panels prior to singulation may have sizes of, or of about, 1 square meter, and may have the form of a square or of a rectangle. Implementations of DBC substrate panels prior to singulation may be wafer-shaped and may have sizes of, or of about, 5 inches by 7 inches.

Implementations of power electronic substrates disclosed herein may be used, by non-limiting example, as substrates for insulated gate bipolar transistor (IGBT) power modules, intelligent power modules (IPMs), power integrated modules (PIMs), power metal-oxide-semiconductor field-effect-transistors (MOSFETs), and the like. In implementations terminals of a semiconductor package may be formed of the copper layers described herein. Packages formed using the power electronic substrates disclosed herein may include top leads, side leads, down leads, glass to metal seals, surface mounts, liquid cooling, and the like.

PIM products may use DBC substrates with thicker copper trace thicknesses while IPM products may use IMS substrates with thinner copper trace thicknesses. Thinner copper traces are better for fine line space for routing while thicker copper traces are better for thermal and electrical performance for power electronic devices. In implementations the power electronic substrates disclosed herein may allow both of these advantages to be realized on a single substrate. In such implementations the thicker copper traces are used for power lines for power electronics while the thinner copper traces may be used for the rest of the circuitry with fine line spacing, and/or for fine pitch circuitry, such as for one or more drivers. The use of some thinner copper traces may reduce overall substrate stress.

In particular implementations a leadframe of a power electronic device may be bonded to the top layer (copper or nickel) of a power electronic substrate described herein. This may be done, in implementations, using a solder, such as by non-limiting example an Sn/Ag/Cu solder.

As may be envisioned, the process of forming an IMS shown in FIG. 17 may be followed up by additional steps to form a stacked IMS. By non-limiting example, a second dielectric layer may be laminated over the traces (and nickel plating, if present) and a second copper layer (having a pattern therein, or not) may then be coupled to the second dielectric layer, with traces later formed in the second copper layer to form the stacked IMS for a power electronic, these later traces having, if desired, multiple thicknesses as previously described with respect to other traces.

Implementations of substrates disclosed herein may utilize principles disclosed in U.S. Pat. No. 7,078,797 listing as inventors Suzuki et al., issued Jul. 18, 2006, titled "Hybrid Integrated Circuit Device," the disclosure of which is hereby entirely incorporated herein by reference. Furthermore, forming ground connections to substrates as illustrated in that reference, such as, by non-limited example shown in FIG. 1B of that reference, may be incorporated into power electronic substrate designs disclosed herein. Forming such connections may be accomplished, by non-limited example, by etching or otherwise forming a through-hole through the dielectric material, ceramic layer, or other insulative layer during processing, using methods disclosed herein, and then coupling an electrical contact on a surface of a die to a grounded metallic baseplate using a wirebond or the like.

Furthermore, substrate implementations like those disclosed herein by use the principles disclosed in U.S. Pat. No. 7,102,211, listing as inventors Ochiai et al., issued Sep. 5, 2006, titled "Semiconductor Device and Hybrid Integrated Circuit Device," the disclosure of which is hereby entirely incorporated herein by reference. Implementations of power electronic substrates disclosed herein may be used to form hybrid integrated circuit (HIC) devices such as those disclosed in that reference. The "fused leads" of an HIC package as shown in that reference, such as by non-limiting example those shown in FIG. 6B (elements 54, 55) of that reference, may be formed of the same copper layer that is used to make the traces 20 described herein.

Substrate implementations like those may be formed employing the principles disclosed in U.S. Pat. No. 7,521,290, listing as inventors Takakusaki et al., issued Apr. 21, 2009, titled "Method of Manufacturing Circuit Device," the disclosure of which is hereby entirely incorporated herein by reference. The methods disclosed therein of attaching a leadframe to multiple substrates (or in other words to a single panel containing multiple non-singulated substrates prior to singulation), to then be singulated, such as by non-limiting example the elements shown in FIG. 3A of that reference, may be incorporated in and/or used together with power electronic devices disclosed herein.

Implementations of substrates like those disclosed herein may be formed using the principles disclosed in U.S. Pat. No. 7,935,899, listing as inventors Takukusaki et al., issued May 3, 2011, titled "Circuit Device and Method of Manufacturing the same," the disclosure of which is hereby entirely incorporated herein by reference. Furthermore, packaging multiple HIC substrates within a single package as disclosed in that reference, such as that shown by non-limiting example in FIG. 1B and described in the specification of that reference, may be accomplished in part by forming several power electronic substrates according to methods disclosed herein in a single panel and then singulating each individual power electronic substrate, such as through punch or saw singulation, and interconnecting die and other components between HIC modules as shown in FIG. 1B of that reference.

In various implementations of substrates disclosed herein, the principles disclosed in U.S. Pat. No. 8,448,842, listing as inventor Wu, issued May 28, 2013, titled "Advanced copper bonding (ACB) with ceramic substrate technology," may be employed, the disclosure of which is hereby entirely incorporated herein by reference. Any of the bonding techniques disclosed therein with respect to bonding copper layers to ceramic layers may be utilized in forming power electronic substrates disclosed herein including, by non-limiting example: forming a copper film having a thickness of less than 1 micron on a ceramic substrate by sputtering deposition under 0.00133 torr and 150 degrees Celsius; plating a copper layer of 10-50 microns at room temperature, and; bonding a copper foil to the ceramic substrate by diffusion bonding under environments of high temperature, vacuum, and negative pressure inertia gas or $H_2$ partial pressure. In implementations a copper layer may be bonded to an aluminum oxide ceramic layer using methods described herein by heating in a sintering furnace up to 1000 degrees Celsius (or higher, such as about 1060 to about 1080 degrees Celsius) to form the eutectic layer described previously. In implementations no sputtering of copper onto a ceramic layer is needed to form the copper layer.

Implementations of substrates disclosed herein that include a nickel layer may employ the methods and principles disclosed in U.S. Pat. No. 7,936,569, listing as inventors Takakusaki et al., issued May 3, 2011, titled "Circuit Device and Method of Manufacturing the same," the disclosure of which is hereby entirely incorporated herein by reference. Furthermore, any of the elements therein describing nickel plating over copper traces, heat sink elements, and other elements used when attaching a die to a copper trace and/or electrically coupling an electrical contact on the die with one or more traces, such as by non-limiting example the elements shown in FIG. 1C of that reference and related description in the specification thereof, may be incorporated and/or used together with power electronic substrates disclosed herein. Additionally, insulating layers and/or dielectric layers described herein may include any of the elements, characteristics, features and the like of resins and/or insulating layers described in U.S. Pat. No. 7,936,569.

Implementations of substrates like those disclosed herein may employ the principles disclosed in Japan Patent Application Publication No. JP-2006-237561, listing as inventors Takakusaki et al., published Sep. 7, 2006, titled "Circuit Device and its Manufacturing Process," the disclosure of which is hereby entirely incorporated herein by reference. Furthermore, any of the elements therein that disclose nickel plating over copper traces, heat sink elements, and other elements used when attaching a die to a copper trace and/or electrically coupling an electrical contact on the die with one or more traces, such as by non-limiting example the elements shown in FIG. 1C of that reference and related description in the specification thereof, may be incorporated and/or used together with power electronic substrates disclosed herein. Additionally, insulating layers and/or dielectric layers described herein may include any of the elements, characteristics, features and the like of resins and/or insulating layers described in U.S. Pat. No. 7,936,569 previously incorporated by reference.

Implementations of substrates like those disclosed herein may be manufactured using the principles disclosed in Japan Patent Application Publication No. JP-2008-022033, listing as inventors Mizutani et al., published Jan. 31, 2008, titled "Hybrid Integrated Circuit Device," the disclosure of which is hereby entirely incorporated herein by reference. Furthermore, any of the v-score techniques applied to the substrates as disclosed therein in at least FIGS. 6-8 and 10, and related disclosure in the specification thereof, may be applied to and/or used with power electronic substrates disclosed herein to aid with singulation. In implementations such v-scores may be applied to the metallic baseplates described herein. In implementations double v-scores may be utilized wherein a plurality of v-scores are on an underside of the metallic baseplate and a corresponding plurality of v-scores are on the upper side of the metallic baseplate and aligned with the v-scores on the underside of the metallic baseplate to aid with singulation.

Figure 31:
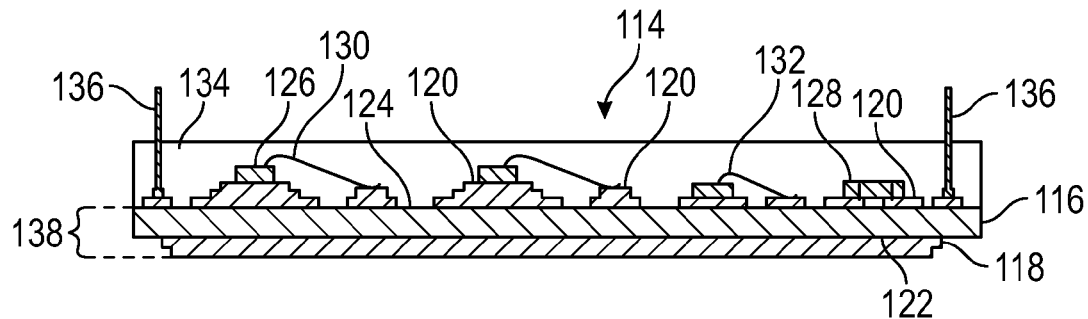
FIG. 31 is a cross-section view of a first implementation of a semiconductor package.

Referring to FIG. 31, a first implementation of a semiconductor package 114 is illustrated. As illustrated, the package 114 includes an electrically insulative layer 116 (which may be a ceramic layer or an insulated metal substrate) and a metallic baseplate 118 coupled thereto at a first surface 122 of the layer 116. A plurality of metallic traces 120 are coupled to a second surface 124 of the electrically insulative layer 116. As can be observed, the some of the plurality of metallic traces have different thicknesses from the others, the thickness being measured perpendicularly to the second surface 124 of the electrically insulative layer 116. Each of the plurality of metallic traces 120 is formed from one or more layers of metal. In particular implementations, the metal may be one of copper, aluminum, nickel, gold, nickel and gold, and any combination thereof. The shape of the cross section of each trace depends on how many metal layers are included in each trace. Collectively, the metallic baseplate 118, the electrically insulative layer 116, and the plurality of metallic traces 120 are referred to as a substrate 138 for the semiconductor package 114. Semiconductor devices 126, 128 are bonded to the plurality of metallic traces 120 at the uppermost exposed metal layer of the traces. Depending on the type of device, wire bonds 130, 132 may be used to connect the devices 126, 128 to the traces 120 or to other devices. Examples of semiconductor devices that could be included in various implementations include power devices, insulated-gate bipolar transistors (IGBTs), diodes, metal oxide semiconductor field effect transistors (MOSFETs), control chips, surface mounted devices (SMDs). The wire bond wires 130, 132 may be made of aluminum, copper, or gold, and any alloy of the same. A mold compound 134 is included that encapsulates the semiconductor devices 126, 128 and at least a portion of the substrate 138. The mold compound may be any disclosed herein and may include silicon-containing gels, epoxies, and any other desired mold compound type. As illustrated, package electrical connectors 136 are included which are coupled to the structure of the substrate 138.

The electrically insulative layer 116 may be formed of a wide variety of materials including, by non-limiting example, ceramic materials, $Al_2O_3$, $Al_4Si_3$, AlN, $ZrO_2$, and other electrically insulating materials, including those disclosed in this document. The metallic baseplate 118 may be a plated first layer of copper or may be a bonded/sintered layer of copper or may be an anodized aluminum or copper layer/piece bonded/plated/sintered/laminated to the electrically insulative layer 116.

Figure 32:
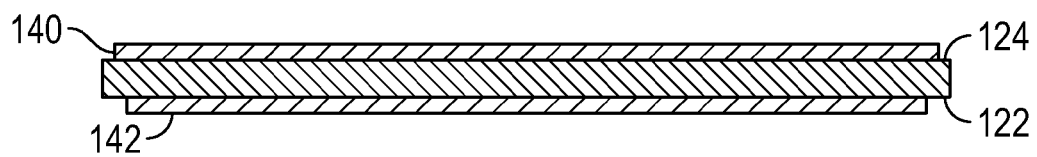
FIG. 32 is a cross-section view of a ceramic layer with a first copper layer plated on a first surface and on a second opposing surface of the ceramic layer.
Figure 33:
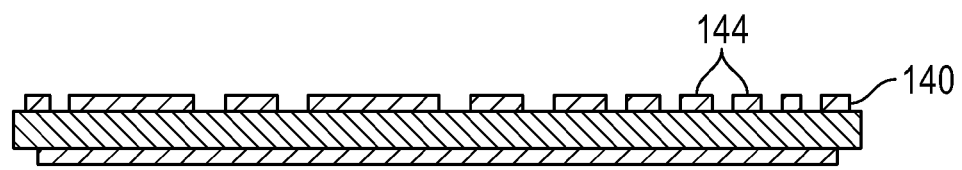
FIG. 33 is a cross-section view of the ceramic layer of FIG. 32 following patterning of the first copper layer on the second side of the ceramic layer.

First implementations of semiconductor packages may be formed using implementations of a method of forming a semiconductor package, where the metal used is copper (though other etchable and platable metals could be used in various implementations). FIG. 32 illustrates electrically insulative layer 116 with a first surface 124 opposing a second surface 122. FIG. 32 shows the structure that exists after a first copper layer 140 has been plated on the second surface 122 and a first copper layer 142 has been plated on the first surface 124. FIG. 33 illustrates the structure after the first copper layer 140 has been patterned using photoresist or other patterning materials disclosed herein and etched using any of the methods disclosed herein to create traces 144 in the layer 140. Implementations of the method include the steps of plating additional copper layers onto the traces 144 formed in the first copper layer 140 and forming traces in each of the additional layers that correspond with the traces in the first copper layer. This process of plating additional copper layers can take place uniformly across all of the traces 144 in the first copper layer 140, or may take place selectively on specific traces using a photoresist patterning and selective plating processes. This process of plating additional copper layers, selectively or uniformly, also can take place on the first copper layer 142 plated on the first surface 124 of the electrically insulative layer 116.

Figure 34:
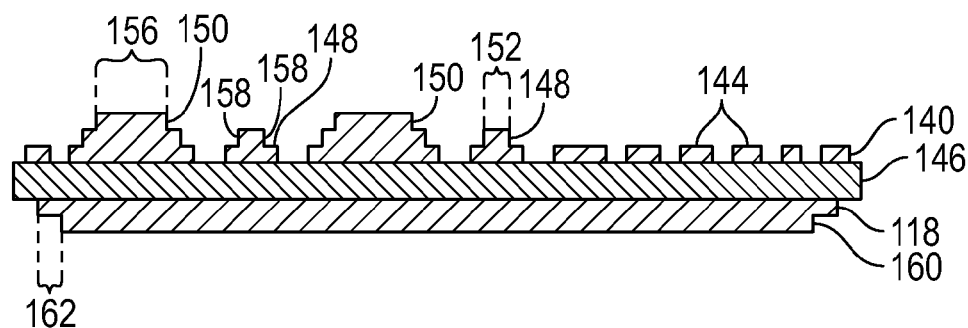
FIG. 34 is a cross-section view of the ceramic layer of FIG. 33 following plating and patterning of second and third copper layers on the second side of the ceramic layer and following plating and patterning of a second layer on the first side of the ceramic layer.

FIG. 34 illustrates a substrate 146 following plating and patterning of additional copper layers on the first surface 124 and the second surface 122. As can be seen, some of the traces 144 in the first copper layer 140 on the second surface 122 remain exposed in selected locations, while other traces have been plated with a second copper layer 148, and some have been plated with a third copper layer 150. By inspection, a width 152 of the traces of the second copper layer 148 is thinner/smaller than a width of the traces 144 of the first copper layer 140. Also, by inspection, a width 156 of the traces of the third copper layer is also thinner/smaller than a width of the traces of the second copper layer 148. The difference in width on each side of the traces of the second copper layer 148 relative to the traces of the first copper layer 140 and the difference in width on each side of the traces of the third copper layer 150 relative to the traces of the second copper layer 148 may be referred to as an offset distance. Because this offset distance is determined during patterning and/or plating of the second copper layer 148 and the third copper layer 150, it may be determined and/or calculated. Likewise, the thickness of each of the first, second, third, and any additional layers of copper may be determined and/or calculated based on desired performance characteristics.

In various implementations, the thicknesses of the layers and the offset distances between layers are selected to reduce stresses in the copper layer(s). By non-limiting example, the thickness of the first copper layer may be about 80 microns, the thickness of the second layer may be about 60 microns, and the thickness of the third layer may be about 40 microns, leading to a total stack thickness of about 180 microns. The offset distance between some, any, or all of the copper layers may be about 50 microns, about 75 microns, about 100 microns, or about 200 microns. Any of these offset distances could be used between any of the layers, i.e., between the first and second layers, the second and third layers, and the third and fourth layers. In a particularly implementation, the largest offset distance in the trace stack may be between the first and second layers. Such a design may help to reduce the stresses in the copper layers most effectively.

The same process of plating additional layers of copper can be used on the first side 122 of the substrate. FIG. 34 illustrates a first copper layer 118 with a second copper layer 160 plated over top of it. Because there may not be traces in the first copper layer 118, the patterning done to the second copper layer 118 may be just to establish an offset distance 162 at the edges of the second copper layer 160. This offset distance 162 is established when the distance from the edge of the electrically insulative layer 116 to the edge of the first copper layer 118 is smaller than the distance from the edge of the electrically insulative layer 116 to the edge of the second copper layer 160. More than two copper layers may be used in various implementations, and any of the copper layers on the first side 122 may be patterned with traces or other heat conductive features in various implementations.

Because of the receding, stepped shape of the multilayered traces, a specially designed solder print stencil may be required to aid in enabling solder printing to allow for bonding of semiconductor devices and other devices onto the traces. Such a stencil may be a solder paste print stencil rather than a typical solder print stencil that requires the surface of the substrate 146 be flat. While the process flow is illustrated in FIGS. 32-33 as being carried out on a single package level, those of ordinary skill will recognize that the process can be carried out in multiple package sizes as well, including panel and multipanel sizes.

Figure 35:
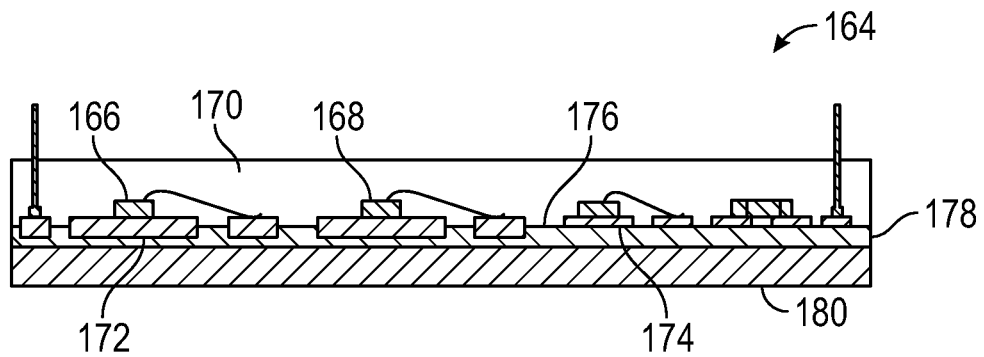
FIG. 35 is a cross-section view of a second implementation of a semiconductor package.
Figure 36:
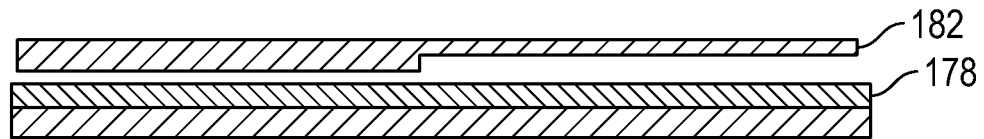
FIG. 36 is a cross-section view of an insulated metal substrate implementation just prior to lamination with a patterned copper layer.
Figure 37:
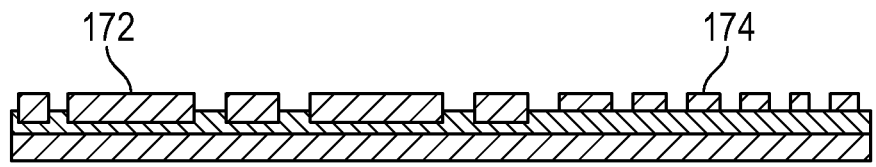
FIG. 37 is a cross-section view of an insulated metal substrate implementation following lamination and subsequent patterning of the patterned copper layer.

Referring to FIG. 35, a second implementation of a semiconductor package 164 is illustrated. Similar to the implementation illustrated in FIG. 31, the package 164 includes various semiconductor devices 166, 168 encapsulated in mold compound 170. The devices 166, 168 are bonded to traces 172, 174. As can be observed, traces 172 have a greater thickness than the traces 174 measured in a direction perpendicular to the second surface 176 of the electrically insulative layer 178. The package implementation 164 illustrated in FIG. 35 has an electrically insulative layer 178 made of an IMS substrate like those disclosed herein and has an anodized aluminum or copper baseplate 180 bonded to it. The traces 172, 174 are formed using the various methods disclosed herein that use IMS substrates. FIG. 36 shows how a patterned copper layer 182 that has been pre-etched to include at least two different layer thicknesses is positioned above the electrically insulative layer 178. FIG. 37 illustrates the traces 172, 174 following lamination of the patterned copper layer 182 with the electrically insulative layer 178 and then patterning and etching of the copper layer 182. Since the surface of the traces 172, 174 is still flat, unlike the implementation illustrated in FIGS. 31-34, a standard solder print stencil can be used. Following creation of the traces 172, 174, the bonding of the various semiconductor devices 166, 168, wire bonding, package electrical connectors/pins bonding and encapsulation can take place using methods like those described in this document.

Figure 38:
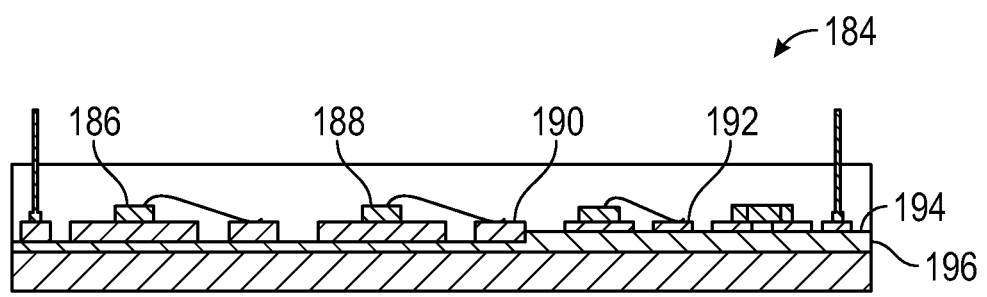
FIG. 38 is a cross-section view of a third implementation of a semiconductor package.
Figure 39:
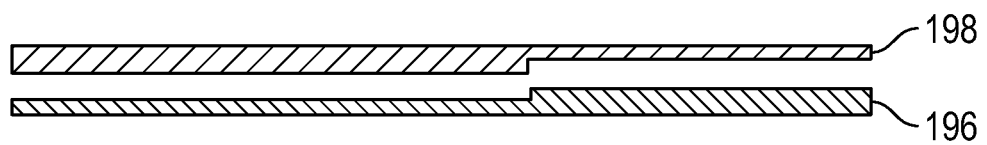
FIG. 39 is a cross-section view of a patterned ceramic layer and a patterned copper layer prior to bonding and sintering.
Figure 40:
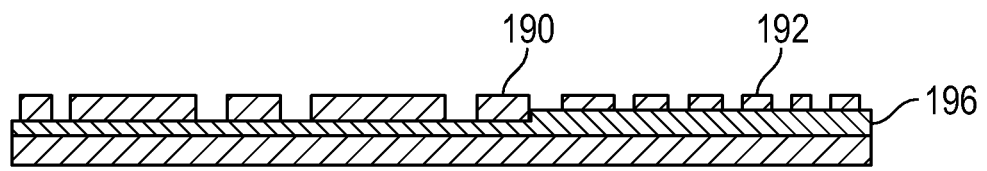
FIG. 40 is a cross-section view of the sintered ceramic substrate following subsequent patterning of the patterned copper layer.

Referring to FIG. 38, a third implementation of a semiconductor package 184 is illustrated. Similar to the implementations illustrated in FIGS. 31 and 35, the package 184 contains semiconductor devices 186, 188 and traces 190, 192 which have two different thickness measured perpendicularly to a second surface 194 of the electrically insulative layer 196. In the package implementation 184, the electrically insulative layer 196 is a ceramic and/or similar material disclosed herein. The process of forming the package is similar to processes described herein that involve similar ceramic-type substrates. Referring to FIG. 39, a pre-patterned copper layer 198 is shown prior to being engaged with electrically insulative layer 196 for sintering. Any of the sintering methods and systems disclosed in this document could be used in various implementations to perform the sintering. FIG. 40 illustrates the structure of the package 184 following sintering and patterning of the pre-patterned copper layer 198 to form the traces 190, 192. Following creation of the traces 190, 192, the bonding of the various semiconductor devices 186, 188, wire bonding, package electrical connectors/pins bonding and encapsulation can take place using methods like those described in this document.

Semiconductor package implementations 114, 164, 184 have traces that have two or more thicknesses. Because of this, as discussed in this document, semiconductor devices that need higher current can be selectively located/bonded to those traces that are of greater thickness and those devices involved in lower current operations (logic, control, etc.) can be located/bonded to those traces that are thinner. As discussed herein, such package types may have reduced copper layer stress, operate with better power distribution, operate at lower temperatures, consume less power, etc.

In places where the description above refers to particular implementations of package/substrate structures and methods of manufacture and implementing components, sub-components, methods and sub-methods, it should be readily apparent that a number of modifications may be made without departing from the spirit thereof and that these implementations, implementing components, sub-components, methods and sub-methods may be applied to other package/substrate structures and methods of manufacture.

What is claimed is:

1. A method of forming a semiconductor package, comprising:
    providing an electrically insulative layer having a first surface opposing a second surface;
    plating a first copper layer onto the second surface of the electrically insulative layer;
    patterning the first copper layer;
    forming traces in the first copper layer by etching through exposed portions of the first copper layer;
    plating a second copper layer onto the traces in the first copper layer;
    patterning the second copper layer;
    forming traces in the second copper layer that correspond with the traces in the first copper layer by etching through exposed portions of the second copper layer;
    bonding at least one semiconductor device with at least one of the traces in the second copper layer;
    encapsulating the at least one semiconductor device with a mold compound; and
    bonding at least one package electrical connector with one of the first copper layer and the second copper layer;
    wherein a width of the traces of the second copper layer are thinner than a width of the traces of the first copper layer by an offset distance.

2. The method of claim 1, further comprising:
    plating a third copper layer onto the traces in the second copper layer;
    patterning the third copper layer;
    forming traces in the third copper layer that corresponding with the traces in the second copper layer by etching through exposed portions of the third copper layer;
    bonding at least one semiconductor device with at least one of the traces in the third copper layer;
    wherein a width of the traces of the third copper layer are thinner than a width of the traces of the second copper layer by an offset distance.

3. The method of claim 1, wherein the first copper layer and the second copper layer have different thicknesses measured perpendicularly to the second surface of the electrically insulative layer.

4. The method of claim 1, further comprising:
    plating a first copper layer on the first surface of the electrically insulative layer;
    patterning the first copper layer;
    removing an exposed portion of the first copper layer;
    plating a second copper layer onto the first copper layer;
    patterning the second copper layer;
    removing an exposed portion of the second copper layer;
    wherein a distance from an edge of the electrically insulative layer to an edge of the first copper layer is smaller than a distance from the edge of the electrically insulative layer to an edge of the second copper layer.

* * * * *